United States Patent [19]

Freeman et al.

[11] 3,865,589

[45] Feb. 11, 1975

[54] PHOTOHARDENABLE LAYER WITH INTEGRAL SUPPORT OF FABRIC OR MESH

[75] Inventors: John Thomas Freeman, Freehold; Robert Bernard Heiart, Middletown; Ernst Leberzammer, New Brunswick, all of N.J.

[73] Assignee: E. I. du Pont de Nemours and Company, Wilmington, Del.

[22] Filed: Jan. 11, 1973

[21] Appl. No.: 322,902

[52] U.S. Cl. .................... 96/35.1, 96/85, 96/115 R, 96/115 P

[51] Int. Cl. ....... G03c 5/00, G03c 1/86, G03c 1/68

[58] Field of Search... 96/85 R, 67 R, 115 R, 115 P, 96/35.1

[56] References Cited

UNITED STATES PATENTS

| | | | |
|---|---|---|---|
| 2,760,863 | 12/1952 | Plambeck | 96/115 P |
| 2,848,327 | 8/1958 | Eichorn | 96/85 R |
| 3,210,187 | 10/1965 | Thommes | 96/115 P |

OTHER PUBLICATIONS

"Glass Fibre Laminates in Cortography", E. W. Jackson British Plastics 6/1950 pp. 272–280.

*Primary Examiner*—Norman G. Torchin
*Assistant Examiner*—Richard L. Schilling

[57] ABSTRACT

A photopolymerizable element containing a self-supporting, reinforced floor is useful for preparing relief images such as those used, for example, in the printing industry. Self-supporting, reinforced floor is provided by incorporating a reinforcing material (e.g., a fabric) within one stratum of the photopolymer element and subsequently flashing the side containing the reinforcing material with actinic radiation resulting in polymerization of the stratum which contains the reinforcing material.

9 Claims, 3 Drawing Figures

PHOTOHARDENABLE LAYER WITH INTEGRAL SUPPORT OF FABRIC OR MESH

BACKGROUND OF THE INVENTION

1. Field of the Invention

This invention relates to photopolymerizable washout elements which are useful in making printing reliefs. More particularly, this invention relates to printing relief elements with an integral reinforced floor comprised of a polymerized portion of the element layer containing a reinforcing structure, and to the method of use and manufacture of such elements.

2. Description of the Prior Art

Photopolymerized elements which are useful for making a printing relief element are described in Plambeck U.S. Pat. Nos. 2,760,863 and 2,791,504 and further in Martin U.S. Pat. Nos. 2,902,365 and 2,927,022. These elements are conventionally used with external supporting layers. Additionally, it was found that these elements were difficult to repair when they were damaged or a correction had to be made prior to use as a printing relief. These difficulties were overcome by Thommes in U.S. Pat. Nos. 3,210,187 and 3,259,499 wherein an improved photopolymerizable element is described containing an integral support layer comprised of a photohardened section or stratum of the element. The integral supporting layer provided in the Thommes invention yields an element that is too fragile and brittle to function in certain printing applications and an additional external support is sometimes necessary. Also, the element described by Thommes would not produce, for example, stereotype copies from a printing relief made therefrom. Belgian Patent No. 596,378 describes a printing screen or stencil comprised of a thick photopolymerized layer containing a fine mesh screen embedded therein. The use of fabric in a photosensitive element for the purpose of making a screen or stencil is also shown by Whitehouse in British Pat. No. 618,181. Screens and stencils, however, depend on removal of the photosensitive element from within the mesh of the screen and printing is accomplished by passing the printing ink through the resulting open areas of the screen. The novel photopolymerizable elements of the present invention have an integral floor or backing in which a reinforcing material is anchored by polymerization of a stratum of the element containing the reinforcing material, leaving the remainder of the element unpolymerized for subsequent imagewise exposure.

SUMMARY OF THE INVENTION

The invention is an improvement in photosensitive elements comprising a solid layer of photopolymerizable material comprised of (a) an organic polymer binding agent, (b) an ethylenically unsaturated compound capable of forming a high polymer by photoinitiated polymerization, and (c) an addition polymerization initiator activatable by actinic light the improvement comprising a polymerized stratum of said layer containing a reinforcing material.

The novel means of anchoring the reinforcing material to the layer, by embedding the reinforcing material in the layer and then photopolymerizing or photocrosslinking a stratum of the layer containing the reinforcing material, provides an element useful in making printing reliefs or molding mats for preparing stereotype copies. Photosensitive elements made according to the invention have improved strength while not requiring external supporting layers and are adaptable to a continuous manufacturing system. These advantages are achieved in accordance with the invention by providing a photosensitive element, polymerizable by actinic light, containing a reinforcing material such as a mesh or fabric embedded in the photopolymerizable layer and then exposing a stratum of said layer containing the reinforcing material to actinic radiation so as to photoharden said stratum by polymerization or cross-linking. An integral reinforcing stratum is thereby formed as a floor for the unpolymerized material remaining thereon. This floor may provide the entire support for the element during the process of use. A composite product may also contain an external removable cover layer on one surface (i.e., that surface farthest from the reinforced floor) and an external removable support layer on the other surface (i.e., that surface nearest the reinforced floor).

DESCRIPTION OF THE PREFERRED EMBODIMENTS

Figure 1:
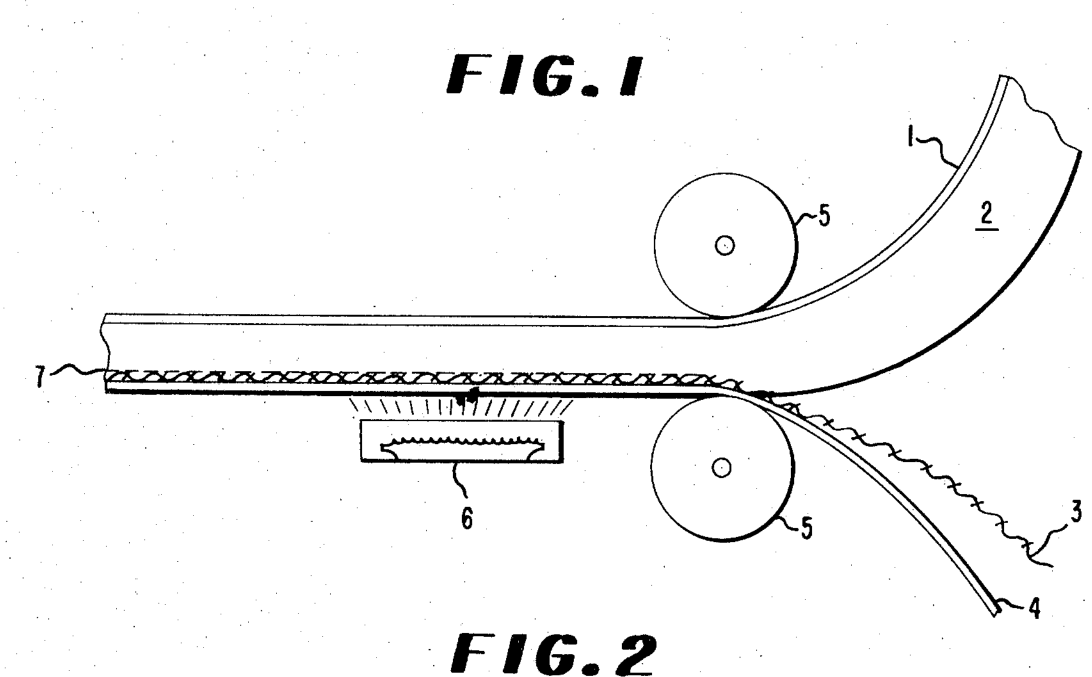
FIG. 1 shows a composite element during a portion of the manufacturing step thereof wherein (1) is a removable cover sheet, (2) a photopolymerizable layer, (3) a mesh reinforcing element, (4) an external, removable support layer, and (5) the laminating means whereby (3) is forcibly impressed into (2), and (1) and (4) are laminated thereon. During lamination layer (2) may be compressed somewhat. Lamp (6) is an exposure source following said laminating means which produces the photohardened zone shown as (7) which contains the mesh (3).
Figure 2:
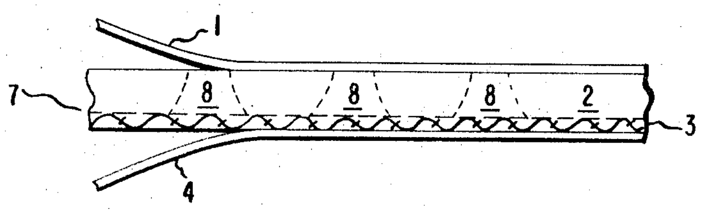
FIG. 2 shows the element after imaging with the photohardened image area (8) indicated by dotted lines. The cover layer (1) and the temporary support layer (4) are removable from the element.

The preferred photosensitive element is comprised of a solid layer from 0.005 to 0.250 inches in thickness of (a) an organic polymer binding agent, (b) an ethylenically unsaturated compound containing 1 to 4 ethylenic groups, having a boiling point above 100°C. at normal atmospheric pressure, a molecular weight less than 1,500 and capable of forming a high polymer by photoinitiated polymerization, (c) an addition polymerization initiator activatable by actinic light and inactive thermally below 185°C. and, if desired, (d) an addition polymerization inhibitor. In the photosensitive layer these components will be present in the respective parts by weight of 40 to 90, 10 to 60, 0.001 to 10.0, and 0.001 to 6.0. Additionally, the the photosensitive layer may also contain plasticizers, fillers, dyes and other adjuvants well known to those skilled in the art.

The mesh reinforcing element incorporated within the photosensitive layer may be woven or fabric-like material. It is preferred to use a marquisette fabric made from stretched and heat set polyethylene terephthalate 70 denier yarn, about 0.005 inches total thickness and about 30 mesh to the square inch. However, any fabric, cloth, metal screen, perforated element or other continuous reinforcing material wherein the open space of the weave is about 3 to 20 times the closed space of the weave (thread diameter in the case of fabrics,) may be used to reinforce the bottom zone of said photosensitive layer. The limitation of open space to thread diameter must be such so as to allow the photosensitive layer to penetrate within the weave of the reinforcing material by the means selected for joining the two materials. If the weave is tight (i.e., 3 times the thread diameter) additional pressure may be needed to insure penetration of photopolymer into the interstices. In such a case, the thread or other material selected is preferably less opaque to actinic radiation so as to allow an exposure sufficient to achieve good polymerization around the reinforcing element. On the other hand, where the open space is about 20 times the diameter of the thread, for example, one may use a relatively gentle pressure to incorporate the reinforcing element within the photosensitive layer and the thread or other material selected may be relatively opaque to actinic radiation and yet obtain the desired polymerization described above.

The mesh-containing side of the element is then given a short, overall flash to actinic light with, for example, a source rich in radiation from the ultraviolet portion of the spectrum such as a fluorescent Blacklight F40 T12 BL lamp (Sylvania Corp.). This flash is of a duration calculated to polymerize the stratum containing the mesh element therein. The resulting flashed stratum becomes insoluble to the liquids used to later develop an image-wise exposure which is given the remainder of the photosensitive element and serves as a reinforced floor for the subsequent image produced. The polymerized, reinforced floor or stratum is therefore ordinarily on one side of the layer, the other side being unpolymerized material.

A temporary, removable cover sheet may be incorporated by lamination to the photosensitive layer farthest from the reinforced floor. This cover sheet serves to protect the photosensitive layer from scratching or damage prior to image-wise exposure described above. It is preferred to use a 0.003 to 0.007 inch thick heat stretched and heat set polyethylene terephthalate film, but any of the other protective layers known and previously described in the art may also be used.

An external support layer may also be applied in a like manner to the element on the side opposite to that containing the cover sheet. It is preferred to use a 0.003 to 0.005 inch thick polyethylene terephthalate film (described above), but thinner or thicker supports can be used. If the reinforced stratum is to be exposed after application of the external support, said support should be transparent to actinic radiation.

A composite element made as described above and shown in the drawings attached hereto may be used as a printing relief element or to prepare stereotype copies therefrom and exhibits improved physical properties not shown by the prior art. The element may be fabricated without either the cover sheet or the external support layer or it may include one without the other. The composite structure may be used with or without the external support sheet. The preferred structure is shown and made as in the attached drawings.

DETAILS OF THE INVENTION

In practicing this invention one may use any photopolymerizable element in which the exposed areas become insoluble to the developing solutions. Those described in Plambeck U.S. Pat. Nos. 2,769,863 and 2,791,504 are suitable as are those described in Martin U.S. Pat. Nos. 2,892,716 and 2,929,710 and Saner U.S. Pat. No. 2,972,540. Particularly useful are, for example, the photopolymers described in Thommes, U.S. Pat Nos. 3,210,187 and 3,259,499. These materials are often mixed or milled together with suitable binders, initiators, fillers, plasticizers or dyes and the resulting rubbery mass calendered or pressed to form the photosensitive layer.

A layer of the desired thickness, after being so formed, is then fed into a suitable laminating means together with the desired reinforcing mesh material. The laminating means force the mesh material into the lower stratum of the relatively soft photopolymer material. A cover sheet may be laminated at the same time to the opposite side of the photopolymer element from that containing the mesh material or it may be applied to the photopolymer element prior to incorporation of the mesh. An external support sheet may also be laminated onto this element at the same time. Both the cover sheet and the support sheet may be removable from the photosensitive layer to facilitate exposure, wash-out development, transfer and subsequent handling of the finished piece. However, the support sheet may also contain an adhesive layer coated thereon to provide the proper adherence with the photopolymer layer so that it cannot be easily stripped therefrom. Both cover and support sheets should be transparent if exposure (i.e., image-wise or support-floor forming) is to be applied through said sheets. The type of sheet, time of application and relative transparency thereof will depend on the desired end-use of the finished element and the system in which it is to be applied.

Support and cover layers that are particularly useful are those formed from the polyesterification product of a dicarboxylic acid and a dihydric alcohol made according to the teachings of Alles, U.S. Pat. No. 2,779,684. Other supports and cover layers may be made of, for example, cellulose acetate, triacetate and mixed esters, etc. However, the polyester films are particularly suitable because of their dimensional stability. The cover and support sheets may be coated with a thin substratum of, for example, urea-formaldehyde/melamine-formaldehyde resin to impart the proper adherence to the photosensitive layer.

Mesh materials useful as the reinforcing element within the photopolymer layer include cotton and other fabrics made from naturally occuring fibers, synthetic fabrics such as nylon, polyesters e.g. polyethylene terephthalate, polypropylene and the like, woven metal fabric-like elements and fiber-glass. A particularly useful fabric is a marquisette made from stretched and heat set polyethylene terephthalate yarn (70 denier warp fill, 50 ends by 32 picks). Any mesh material may be used as the reinforcing element and function within the scope and ambit of this invention but preferably the open space of the weave is about 3 to 20 times the dimension of the closed space. Monofilament fabrics may also be used but the method of incorporation within the photopolymer element may differ somewhat from a yarn-like fiber.

The combined element of photopolymer and mesh material is then given an over-all flash on the surface nearest the mesh material of duration and intensity calculated to polymerize the photopolymer adjacent to, around and through said mesh material. The exposed, polymerized material is then insoluble in the solution used to wash-out the unpolymerized matrix following an image-wise exposure on the opposite side to the mesh-containing side receiving the over-all flash. Thus the mesh material reinforces the polymerized matrix resulting in a "floor" below the following image and serves to support the image characters. These elements are especially useful in the printing industry. One important application is in the newspaper industry. Here, so-called "stereo-masters" are made from which molds are prepared in which the metal printing plate is cast. The element of the invention is particularly useful in making the stereo-master plate wherein the negative transparency of the image (such as produced by phototypesetting) to be printed is laid directly on the photopolymer, exposed image-wise to actinic light and the image developed by washing out the unexposed areas with, a suitable fluid for example aqueous NaOH solution. The unexposed portions are removed preferably down to the mesh reinforced floor which serves to hold the raised image areas, prevents image destruction during the succeeding steps of the process and contributes to dimensional stability of the final element. Said reinforced floor may be used to support the imaged plate entirely or one may leave the support sheet in place for additional support. From a relief plate made as above a complementary copy is made by pressing or rolling papier mache' into said relief plate using about 5,000 pounds/sq. inch pressure. This pressure exerts severe strain on the stereo-master plate and if said plate does not contain a reinforced floor as described herein, the image areas can be damaged. The papier mache' is then stripped from the relief plate, dried and the final printing made by pouring molten lead into the mache' mold.

A conventional process used for preparing the stereo-master involves coating a photoresist element onto a zinc or magnesium plate, image-wise exposure of said photoresist, wash-out development followed by acid etching of the metal surface to produce the stereo-master. Strong inorganic acids (e.g. $HNO_3$) are used and ecologically undesirable heavy metal salts are produced as waste. The system using the element of the invention, possible due to its improved strength, does not require acid etching and obviates the problems it causes. Since many plates are made each day for the typical newspaper, the improved system reduces the safety and disposal problems previously encountered.

The element described herein may also contain an antihalation layer or, alternatively, may contain a dye admixed within the photopolymer matrix to provide antihalation protection and good image quality. It is preferred to add a dye directly to the photopolymer matrix because a dyed structure assists the operator in inspecting the finished piece for possible damage by making the resulting image more visible. Other elements which may also be contained within the image forming layer such as initiators, dyes, binders, etc. are disclosed in, for example, U.S. Pat. No. 3,259,499 and may be used as well in the formulations of this invention.

This invention will now be illustrated by, but not limited to, the following examples:

EXAMPLE I

A photopolymerizable composition was prepared by placing a mixture consisting of 2,618 g. of cellulose acetate succinate flake, 1,320 g. of triethylene glycol diacrylate, 9.24 g. of p-methoxyphenol and 5.28 g. of 2-ethylanthraquinone on a rubber mill preheated to about 130°C and milling for about 20 minutes to yield a homogeneous mass. This mass was fed into a calender to yield a photopolymerizable sheet 0.042 inches thick and this sheet was laminated to a 0.004 inch thick polyethylene terephthalate film (cover sheet) coated on both sides with a vinylidene chloride/alkyl acrylate/itaconic acid copolymer mixed with an alkyl acrylate and/or methacrylate polymer as described by Rawlins, U.S. Pat. No. 3,443,950. The side nearest the photopolymer sheet was also coated with a thin anchoring substratum of gelatin (0.5 mg/dm$^2$). This laminate [shown as (1) and (2) in FIG. 1] was then simultaneously calendered with a Dacron marquisette fabric (Burlington Industries, 70 denier, 50 by 32 count) and a conventional 0.005 inch cellulose triacetate photographic film support (Bexford Ltd., Type U51) shown as (3) and (4) respectively in FIG. 1.

The resulting sandwich was stripped of its polyester cover sheet and exposed through the cellulose acetate support side for about 4 seconds at a distance of about 3 inches from an array of closely spaced Blacklight tubes (Sylvania Corp. FR 48T 12-BL-VHO-180) which served to form a polymerized floor about 0.009 inch thick (including the fabric reinforcing material) and further to photocondition the remainder of the photopolymerizable layer. A negative test transparency containing line and halftone images was laid on the photopolymerizable layer and an exposure was made through said test image using the above light source. The exposure was made while the plate and test image were under 15 inches of vacuum in a suitable vacuum frame to hold the test image in intimate contact with the photopolymerizable element. After about 3 minutes exposure the photopolymerizable element was developed by removing the unexposed areas of the photopolymerized segment by spray-washing the surface for about 8 minutes with an 0.04N aqueous NaOH solution at 30°C yielding a relief plate consisting of 0.033 inches of relief, 0.09 inches of reinforced floor and 0.005 inches of cellulose triacetate external support.

The relief plate was then covered with papier mache' matting material (Super Flong, Wood Flong Corp., Hoosick Falls, N.Y.) and said matting pressed into the relief plate using about 4,000 pounds per square inch. After stripping off the matting it was suitable for preparing a cast-metal stereo plate for use as a printing plate.

EXAMPLE II

A photopolymerizable composition similar to that described in Example I but additionally containing 0.02 percent by weight of Luxol Fast Blue AR (Colour Index Solvent Blue 37), dye, was calendered into a 0.049 inch thick sheet as described in Example I and laminated to a 0.007 inch thick polyethylene terephthalate cover sheet as also described therein. This composite element was further calendered with the same Dacron marquisette fabric reinforcing element described in Example I but with a 0.004 inch thick polyethylene terephthalate external support sheet in place of the cellulose triacetate film yielding an ultimate composite structure of cover sheet (1), photopolymer element (2), reinforcing material (3) and support sheet (4) wherein the cover and support sheets were subbed as described in Example I with the gelatin sub side being nearest the photopolymer element in each case.

This composite structure was then stripped of its cover sheet and exposed through the support sheet for about 60 seconds at about 3 inches from an array of Blacklight tubes (same as Example I) through a filter which removes substantially all radiation below 390 nanometers to produce about 0.011 inch thick floor by polymerization in and around the fabric reinforcing element. This exposure additionally served to photocondition the remainder of the photopolymer element. An image-wise exposure was then performed as described in Example I for 2¼ minutes and the image developed by spray-washing as described therein and a relief plate comprised of about 0.038 inches of relief, about 0.011 inches of reinforced floor on a 0.004 inch external support was obtained.

Figure 3:
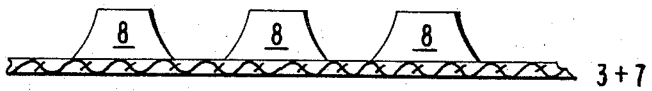
FIG. 3 shows the exposed element after a typical washout development whereby the unpolymerized areas have been removed. This product is now suitable for use as a relief printing element, for example.

Said relief plate was then post-exposed for 10 minutes under 15 inches of vacuum to the source described above to further harden the photopolymer and the external support sheet stripped therefrom yielding the product shown in FIG. 3.

The relief image was then sprayed with a release agent (e.g. colloidal graphite, Sprayon Products, Inc., Reynolds Ink Division, Bedford Heights, Ohio) and the relief plate placed image side down on a molding matrix comprised of Bakelite resin (Williamson Red Top T142R) coated on a fiber board (Wilsolite 960 Floor 125). Prior to placing the relief image on the Bakelite surface, said surface was sprayed with the release agent described above and preheated at 150°C. for 2¾ minutes to soften the Bakelite. The sandwich of relief element and molding matrix was then covered with an insulting board, placed in steel platens and pressed at 150°C. for 10 minutes under 15,000 psi pressure in a standard press to cure the Bakelite. After cooling, the relief image was stripped of the molding matrix yielding a mold suitable for making, for example, rubber printing plates therefrom.

EXAMPLE III

A composite element made according to Example I was stripped of its cover sheet and laid support side down in a press. Three subsequent layers of photopolymer made according to Example I without the fabric reinforcing structure, cover or support sheets, were laid on top of this element and pressed at 150°C. for 1 minute at 10,000 psi, 1 minute at 20,000 psi and 2 minutes at 40,000 psi yielding an element consisting of 0.150 inches of photopolymer with a fabric reinforcing element in the lower stratum thereof and a 0.005 inch thick cellulose triacetate support sheet. This element was then conditioned by holding in a $CO_2$ environment for 6 days. The conditioned element was then exposed through the support sheet to the exposure source described in Example I for 15 seconds through a filter which removes substantially all radiation of wavelengths shorter than 390 nanometers to polymerize said lower stratum incorporating the fabric reinforcing structure therein (about 0.009 inches thick).

An image-wise exposure was then made by exposing the test image of Example I laid on the photopolymer layer under 15 inches of vacuum to a 5 kilowatt Macbeth carbon arc at a distance of 50 inches. After developing the resulting image by spray-washing according to Example I, the resulting relief plate was found to have an excellent image of the test pattern suitable for molding or printing therefrom.

EXAMPLE IV

A photopolymerizable element similar to Example I additionally containing 0.06 percent by weight Luxol Fast Blue AR (Colour Index Solvent Blue 37) was prepared by calendering so as to contain a 0.007 inch thick polyester cover sheet (1), 0.017 inch thick photopolymer layer (2) containing a Nylon fabric reinforcing material incorporated therein. (Burlington Industries Inc. Style No. 21619, 30 denier, 90 × 92 count) (3) and a 0.004 inch thick polyester support sheet (4). The resulting product was exposed as shown in FIG. 1 to a series of Blacklight tubes (Sylvania Corp. F20 T12-BL) at a distance of 2 inches from said support sheet (6). This exposure was adjusted to cause polymerization to occur about 0.008 inches into said photopolymer incorporating the Nylon fabric reinforcing structure therein.

After removal of the cover sheet, the test image of Example I was exposed in the manner of Example I for 8 minutes and the image resulting therefrom developed as described therein. The relief image (about 0.009 inches thick), from which the support was stripped, was mounted in an off-set press and excellent letterset copies were obtained therefrom.

The photosensitive elements of this invention can employ any photohardenable material which, on exposure, will become inert to whatever means is used to develop the relief image, e.g. become insoluble in the wash-out solutions. Such materials include the photopolymerizable and photocrosslinkable systems of the prior art.

The amount of exposure given to the elements in order to form the polymerized floor should be sufficient to photoharden a stratum of the layer at least as thick as the reinforcing mesh. However, no more than about one half, and preferably less than one third, of the layer should be hardened to form the floor of the element. Sufficient unhardened material must remain to form a relief image upon subsequent imagewise exposure and development.

We claim:

1. In a photosensitive element comprising a solid layer of photopolymerizable material comprised of (a) an organic polymer binding agent, (b) an ethylenically unsaturated compound capable of forming a high polymer by photoinitiated polymerization, and (c) an addition polymerization initiator activatable by actinic light, the improvement comprising a polymerized stratum of said layer located on one side of said layer containing a fabric or mesh reinforcing material.

2. A photosensitive element according to claim 1 wherein said reinforcing material is a fabric, the open space of the weave of said fabric being about 3 to 20 times the close space of the weave.

3. A photosensitive element according to claim 1 having a removable cover sheet on the side of the layer farthest from said polymerized stratum and an external support layer on the opposite side.

4. A photosensitive element according to claim 1 wherein said photopolymerizable material contains a polymerization inhibitor.

5. In a photosensitive element comprising a solid layer of photocrosslinkable polymeric material, the improvement comprising a crosslinked stratum of said layer located on one side of said layer containing a fabric or mesh reinforcing material.

6. A method of anchoring a fabric or mesh reinforcing material to a photosensitive element having a layer of an ethylenically unsaturated photohardenable material, comprising embedding the reinforcing material in one side of the photohardenable layer and exposing that side of the layer to actinic light sufficient to photoharden a stratum in the side of the layer containing the reinforcing material and leave the remainder of the layer unhardened.

7. A method according to claim 6 wherein the embedding is performed by calendering.

8. A method of preparing a papier mache' printing mold comprising exposing the element of claim 1 imagewise on the unpolymerized side, washing out the unexposed areas so as to form a relief and pressing papier mache' into the relief.

9. In a photosensitive element comprising a solid layer of ethylenically unsaturated photohardenable material the improvement, comprising a photohardened stratum of said layer located on one side of said layer containing a fabric or mesh reinforcing material.

* * * * *